(12) United States Patent
Ban et al.

(10) Patent No.: US 8,312,394 B2
(45) Date of Patent: Nov. 13, 2012

(54) METHOD AND APPARATUS FOR DETERMINING MASK LAYOUTS FOR A SPACER-IS-DIELECTRIC SELF-ALIGNED DOUBLE-PATTERNING PROCESS

(75) Inventors: Yonchan Ban, Austin, TX (US); Kevin D. Lucas, Austin, TX (US)

(73) Assignee: Synopsys, Inc., Mountain View, CA (US)

( * ) Notice: Subject to any disclaimer, the term of this patent is extended or adjusted under 35 U.S.C. 154(b) by 32 days.

(21) Appl. No.: 12/955,670

(22) Filed: Nov. 29, 2010

(65) Prior Publication Data

US 2012/0137261 A1 May 31, 2012

(51) Int. Cl.
*G06F 17/50* (2006.01)
(52) U.S. Cl. ............ 716/50; 716/51; 716/52; 716/53; 716/54; 716/55
(58) Field of Classification Search ............ 716/50, 716/51, 52, 53, 54, 55
See application file for complete search history.

(56) References Cited

U.S. PATENT DOCUMENTS

2011/0014786 A1 * 1/2011 Sezginer et al. ............ 438/618
2011/0113393 A1 * 5/2011 Sezginer .................... 716/106

* cited by examiner

*Primary Examiner* — Thuan Do
*Assistant Examiner* — Brian Ngo
(74) *Attorney, Agent, or Firm* — Park, Vaughan, Fleming & Dowler LLP; Laxman Sahasrabuddhe

(57) ABSTRACT

Methods and apparatuses are described for determining mask layouts for printing a design intent on a wafer using a spacer-is-dielectric self-aligned double-patterning process. A system can determine whether a graph corresponding to a design intent is two-colorable. If the graph is not two-colorable, the system can merge one or more pairs of shapes in the design intent to obtain a modified design intent, so that a modified graph corresponding to the modified design intent is two-colorable. The system can then determine a two-coloring for the modified graph. Next, the system can place one or more core shapes in a mandrel mask layout which correspond to vertices in the modified graph that are associated with a selected color in the two-coloring. The system can then place one or more shapes in a trim mask layout for separating the shapes in the design intent that were merged.

24 Claims, 8 Drawing Sheets

DESIGN INTENT 202

MANDREL MASK 204

FIRST LITHO/ETCH

SPACER DEPOSITION AND ETCH

SPACER

ADD PLANARIZING BARC

REMOVE MANDREL

OPENINGS IN THE TRIM MASK 206

SECOND LITHO/ETCH

DIELECTRIC ETCH AND METAL FILL

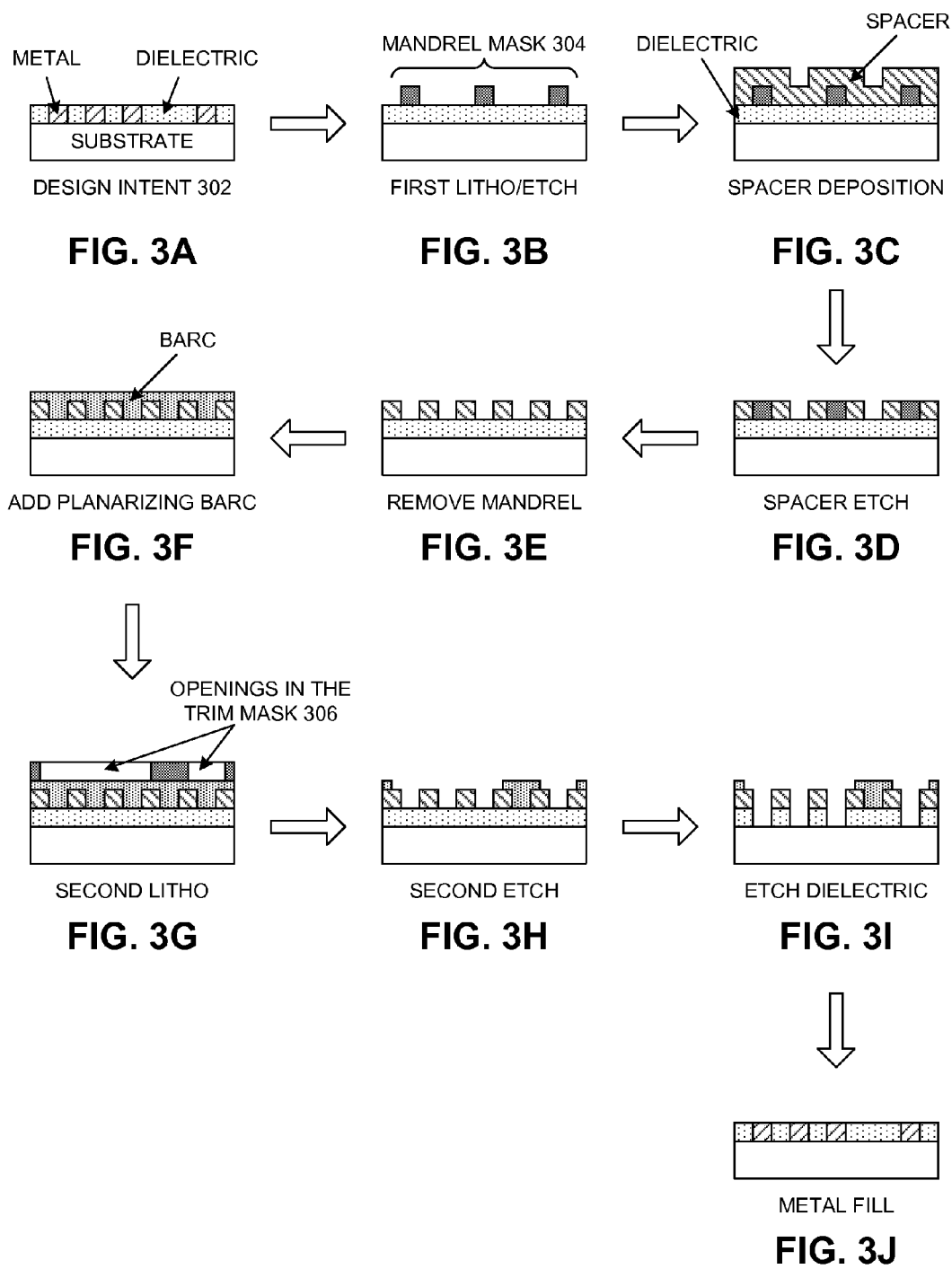

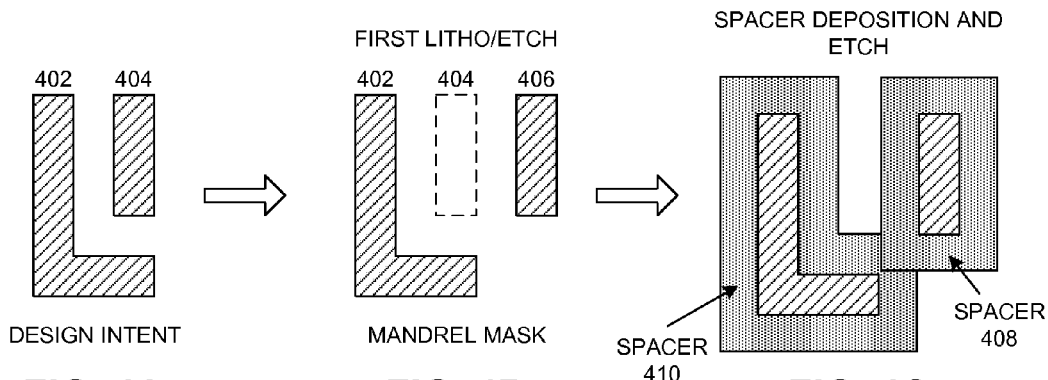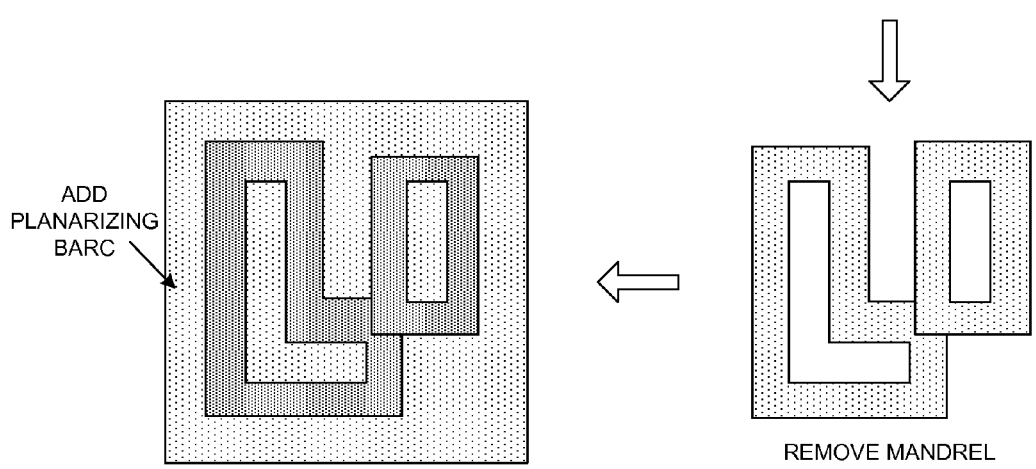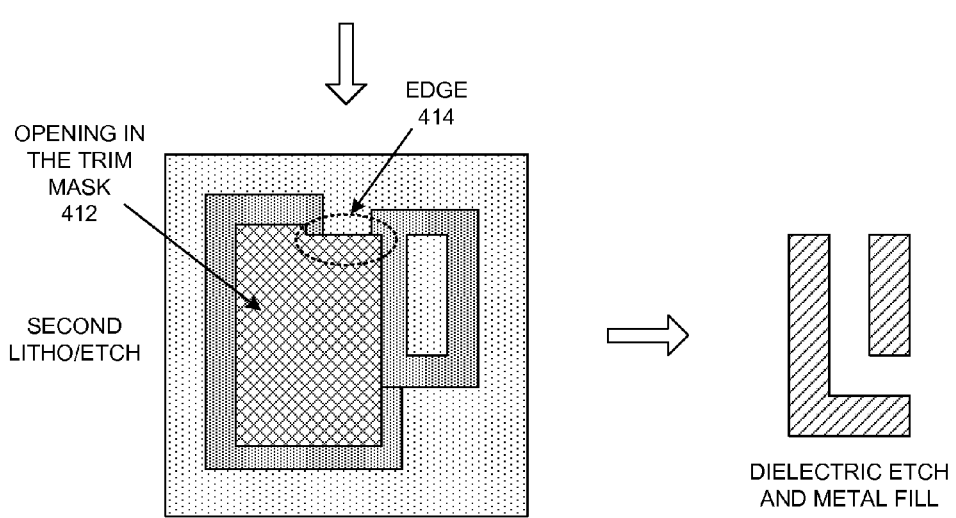

DESIGN INTENT
500

GRAPH
550

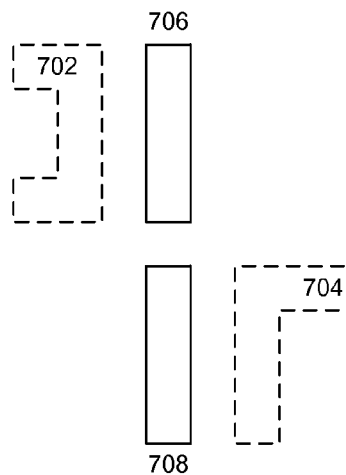
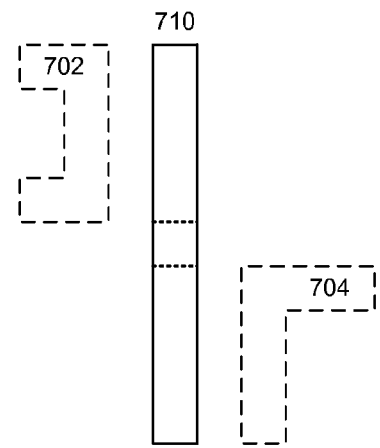
FIG. 7A  FIG. 7B
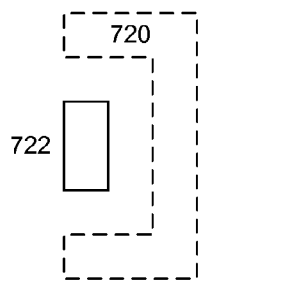
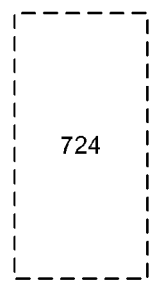
FIG. 7C  FIG. 7D
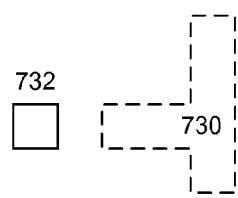
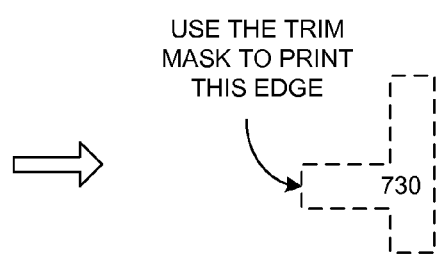
FIG. 7E  FIG. 7F

METHOD AND APPARATUS FOR DETERMINING MASK LAYOUTS FOR A SPACER-IS-DIELECTRIC SELF-ALIGNED DOUBLE-PATTERNING PROCESS

TECHNICAL FIELD

This disclosure relates to electronic design automation (EDA). More specifically, this disclosure relates to systems and techniques for determining mask layouts for a spacer-is-dielectric self-aligned double-patterning process.

BACKGROUND

1. Related Art

Dramatic improvements in semiconductor integration densities have largely been achieved through corresponding improvements in semiconductor manufacturing technologies. As semiconductor manufacturing technologies move into the deep submicron era, the semiconductor industry is considering a number of new technologies, such as extreme ultraviolet (EUV) lithography and massively parallel electron beam lithography. Unfortunately, these technologies are not ready for production as yet.

The spacer-is-dielectric (SID) self-aligned double-patterning (SADP) process is a technology that can increase integration densities using today's process technologies. This technology uses two masks and a spacer deposition step to realize features on a wafer. It is desirable to be able to determine mask layouts to print complex design intents using an SID SADP process.

2. Summary

Some embodiments described in this disclosure provide methods and apparatuses for determining a mandrel mask layout and a trim mask layout based on a design intent. In some embodiments, the design intent includes two-dimensional patterns that correspond to a circuit design that implements an arbitrary logic function. The mandrel mask layout and the trim mask layout can be used in an SID SADP process to print the design intent on a wafer. In this disclosure, unless otherwise stated, the phrase "based on" means "based solely or partly on."

During operation, a system can determine whether a graph corresponding to a design intent is two-colorable. Each vertex in the graph can correspond to a shape in the design intent, and each edge in the graph can correspond to two shapes in the design intent that are separated by a space that is less than a pre-determined distance. Note that the minimum spacing that is allowed between two shapes can depend on various parameters associated with the shapes. In some embodiments, the minimum allowable spacing between two shapes can be determined based on a set of design rules. If the graph is not two-colorable, the system can merge one or more pairs of shapes in the design intent to obtain a modified design intent, so that a modified graph corresponding to the modified design intent is two-colorable. The system can then determine a two-coloring for the modified graph. Next, the system can place one or more core shapes in the mandrel mask layout which correspond to vertices in the modified graph that are associated with a selected color in the two-coloring. The system can then place one or more shapes in the trim mask layout for separating the shapes in the design intent that were merged.

In some embodiments, the system can identify a pair of shapes in the design intent that have a substantially minimum run length, wherein merging the pair of shapes resolves a coloring conflict. The system can then merge the pair of shapes in the design intent. Substantially minimizing the run length of the merged shapes can improve manufacturability of the design intent.

In addition to the core shapes, the system can place additional shapes in the mandrel mask layout to print one or more edges of the design intent that are not printed by the core shapes. In some embodiments, the system can merge and/or remove additional shapes in the mandrel mask to improve manufacturability of the design intent.

Specifically, in some embodiments, the system can identify a first additional shape and a second additional shape in the mandrel mask layout which are separated by a space that is less than a pre-determined distance. Next, the system can merge the first additional shape and the second additional shape.

In some embodiments, the system can identify an additional shape in the mandrel mask layout that is smaller than a pre-determined size, and remove the additional shape from the mandrel mask layout. In some embodiments, removing the additional shape effectively retargets the design intent. In some embodiments, the system may add one or more shapes in the trim mask layout to print one or more edges in the design intent that are not printed by the mandrel mask layout.

BRIEF DESCRIPTION OF THE FIGURES

FIGS. 3A-3J illustrate cross-sectional views of a wafer in an SID SADP process.

FIGS. 4A-4G illustrates how an SID SADP process can be used for printing a design intent that includes a two-dimensional pattern.

FIGS. 7A-7F illustrate how additional shapes in the mandrel mask layout can be removed and/or merged to reduce complexity and/or improve manufacturability of the masks.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Figure 1:
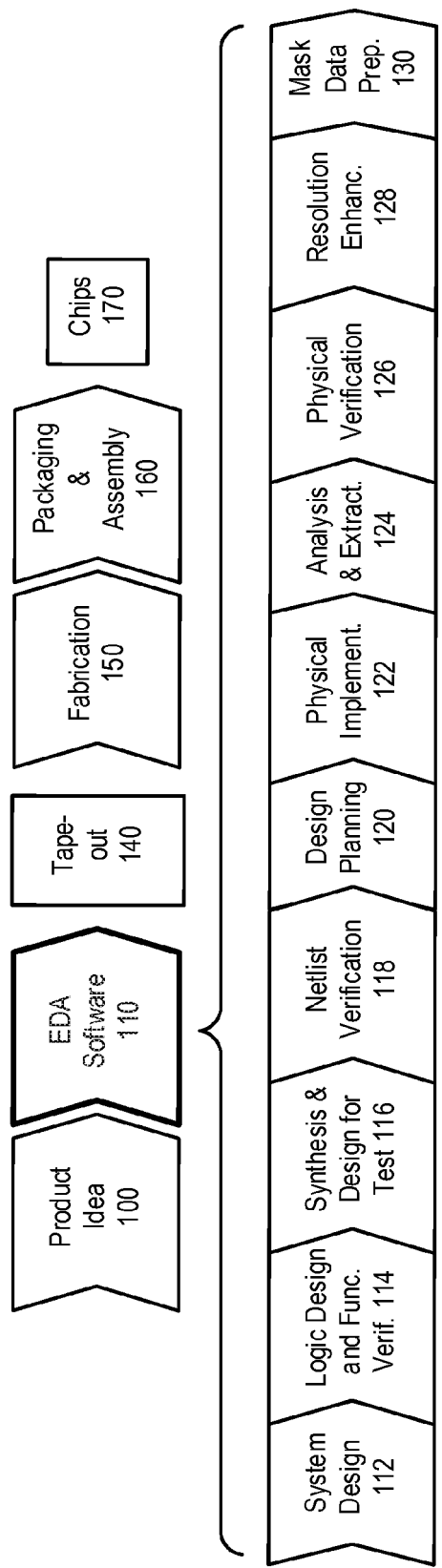
FIG. 1 illustrates various steps in the design and fabrication of an integrated circuit.

FIG. 1 illustrates various steps in the design and fabrication of an integrated circuit. The process starts with a product idea 100, which is realized using Electronic Design Automation (EDA) software 110. Chips 170 can be produced from the finalized design by performing fabrication 150 and packaging and assembly 160 steps.

A design flow that uses EDA software 110 is described below. Note that the design flow description is for illustration purposes only, and is not intended to limit the present invention. For example, an actual integrated circuit design may require a designer to perform the design flow steps in a different sequence than the sequence described below.

In the system design step 112, the designers can describe the functionality to implement. They can also perform what-if planning to refine the functionality and to check costs. Further, hardware-software architecture partitioning can occur at this step. In the logic design and functional verification step 114, a Hardware Description Language (HDL) design can be created and checked for functional accuracy.

In the synthesis and design step 116, the HDL code can be translated to a netlist, which can be optimized for the target technology. Further, tests can be designed and implemented to check the finished chips. In the netlist verification step 118, the netlist can be checked for compliance with timing constraints and for correspondence with the HDL code.

In the design planning step 120, an overall floor plan for the chip can be constructed and analyzed for timing and top-level routing. Next, in the physical implementation step 122, placement and routing can be performed.

In the analysis and extraction step 124, the circuit functionality can be verified at a transistor level. In the physical verification step 126, the design can be checked to correct any functional, manufacturing, electrical, or lithographic issues.

In the resolution enhancement step 128, geometric manipulations can be performed on the layout to improve manufacturability of the design. Finally, in the mask data preparation step 130, the design can be taped-out 140 for production of masks to produce finished chips.

Figure 2A:
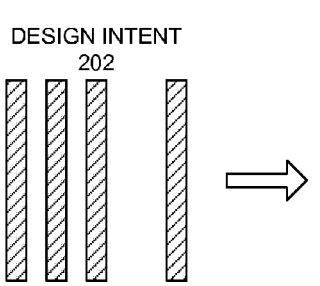
FIGS. 2A-2G illustrate a top view of an SID SADP process.
Figure 2B:
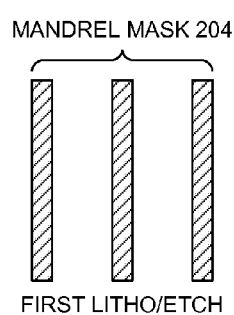

FIGS. 2A-2G illustrate a top view of an SID SADP process. FIG. 2A illustrates design intent 202 that is desired to be transferred to a wafer using the SID SADP process. FIG. 2B illustrates mandrel mask layout 204 that includes only some of the lines in design intent 202. Mandrel mask layout 204 is used in the first lithography and etch stage to create features on the wafer.

Figure 2C:
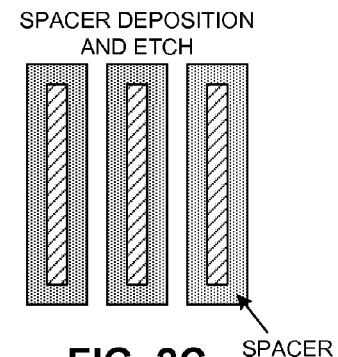
Figure 2E:
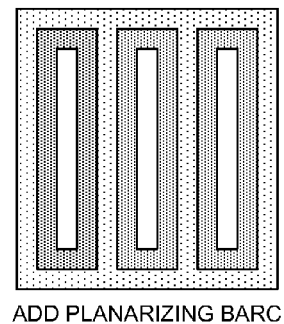
Figure 2D:
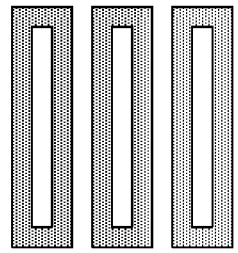
Figure 2F:
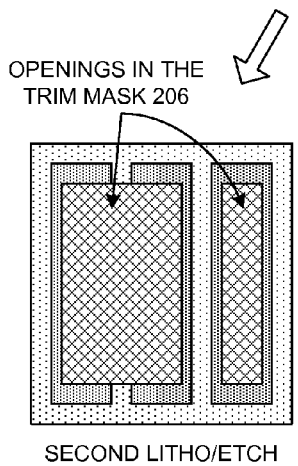
Figure 2G:
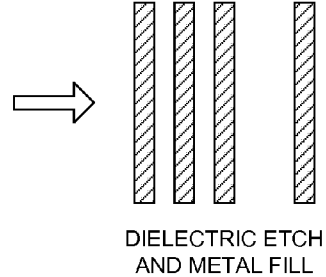

Next, the process can perform spacer deposition and etch as shown in FIG. 2C. The SID SADP process can then remove the mandrel as shown in FIG. 2D. Next, as shown in FIG. 2E, the process can add planarizing bottom anti-reflecting coating (BARC). The process can then perform a second lithography and etch step using a trim mask layout as shown in FIG. 2F. Openings in the trim mask 206 correspond to the regions in the resist layer that are exposed. After the second lithography step, the BARC corresponding to the exposed region can be etched. Next, as shown in FIG. 2G, the process can etch the dielectric, and perform metal fill to obtain the target features on the wafer.

FIGS. 3A-3J illustrate cross-sectional views of a wafer in an SID SADP process. The cross-sectional views illustrated in FIGS. 3A-3J are related to the top views illustrated in FIGS. 2A-2G. Design intent 302 can comprise dielectric regions and metal regions. As shown in FIG. 3B, the process can use mandrel mask layout 304 in a photolithography and etch process to create sacrificial structures on a dielectric layer. These sacrificial structures may be referred to as mandrel or core features. Note that mandrel mask layout 304 includes patterns that correspond to only some of the metal regions in design intent 302.

Next, as shown in FIG. 3C, a spacer material can be deposited on the mandrel features to create a conforming spacer layer on top of the mandrel features. The SID SADP process can then etch the spacer layer to obtain the structure shown in FIG. 3D. Next, as shown in FIG. 3E, the mandrel features can be removed by using an etch technique that selectively etches the mandrel material but not the spacer material. Note that the spacing between structures in FIG. 3E is less than the minimum spacing that was allowed in the first lithography and etch step that was used to create the structures in FIG. 3B. As shown in FIG. 3F, the process can then add a layer of planarized BARC on top. Next, a trim mask layout can be used to perform a second lithography step as shown in FIG. 3G. Specifically, openings in the trim mask 306 correspond to regions in the resist layer that are exposed. The structure shown in FIG. 3H may be obtained after etching the exposed BARC and then stripping off the remaining photoresist.

Next, the dielectric can be etched as shown in FIG. 3I. Finally, metal fill can be performed to obtain the desired structure shown in FIG. 3J.

Design intent 202 shown in FIG. 2A is a line-and-space pattern which is a one-dimensional pattern. Determining mandrel and trim mask layouts for such one-dimensional patterns can be relatively straightforward. However, determining the mandrel and trim mask layouts for a two-dimensional pattern can be non-obvious. Some embodiments described in this disclosure provide systems and techniques for determining mandrel and trim mask layouts for two-dimensional patterns, e.g., patterns that are commonly found in design intents for random logic designs.

FIGS. 4A-4G illustrate how an SID SADP process can be used for printing a design intent that includes a two-dimensional pattern.

FIG. 4A illustrates a design intent that includes a two-dimensional pattern. The relative positions of shapes 402 and 404 may be such that they cannot be printed on a wafer using a single step of the photolithography and etch process. FIG. 4B illustrates the shapes on the mandrel mask layout that can be used in the first photolithography step.

Note that shape 402 is included on the mandrel mask layout, but shape 404 is not included. Shape 406 is added to the mandrel mask layout to print the right edge of shape 404. The mandrel mask layout includes two types of shapes. Core shapes (e.g., shape 402) are those shapes in the mandrel mask layout that are identical to shapes in the design intent. Additional shapes (e.g., shape 406) in the mandrel mask layout are shapes that are related to shapes in the design intent, but which are not identical to the shapes in the design intent. For example, an additional shape may have a different location and/or may look different from the corresponding shape in the design intent. The location of design intent shape 404 is shown using dashed lines in FIG. 4B to illustrate the position of additional shape 406 with respect to design intent shape 404. As shown in FIG. 4C, after spacer deposition, the right edge of shape 404 is aligned with the left edge of spacer 408, and the left and bottom edges of shape 404 are aligned with the "L" shaped edge of spacer 410.

Next, the mandrel can be removed (FIG. 4D) and planarizing BARC can be added (FIG. 4E). FIG. 4F illustrates a trim mask layout which can be used in the second photolithography step. Specifically, opening in the trim mask 412 corresponds to regions in the resist layer that are exposed. Edge 414 in the trim mask layout prints the top edge of shape 404. FIG. 4G illustrates the final shape of the features after a dielectric etch step and a metal fill step are performed.

In some embodiments, the system can use graph coloring to determine which shapes are assigned to the mandrel mask layout. Specifically, the system can represent shapes using vertices. Next, the system can create an edge between two vertices if the associated shapes are separated by a space that is less than a minimum spacing (which may be determined based on a set of design rules) that can be created by a single application of the photolithography process. The system can then determine a two-coloring for the graph. The shapes that are associated with vertices of a first color can be assigned to the mandrel mask layout, and the shapes that are associated with vertices of a second color can be used to determine the additional shapes in the mandrel mask layout. The shapes in the trim mask layout can be determined based on the core shapes and the additional shapes in the mandrel mask layout. Specifically, the trim mask may include shapes for printing edges in the design intent that are not printed by shapes in the mandrel mask.

For example, the system may represent shapes 402 and 404 by vertices and create an edge between these two vertices because these two shapes are separated by a space that is less than a minimum spacing that can be created by the photolithography process. Next, the system can determine a two-coloring for the graph, e.g., the vertices associated with shapes 402 and 404 may be assigned different colors.

The system may then select a color for determining the core shapes in the mandrel mask layout. For example, the system may select the color in the two-coloring that is associated with shape 402, and place shape 402 as a core shape in the mandrel mask layout. Next, the system may determine additional shape 406 based on shape 404 which is associated with the other color. Additional shape 406 can be placed in the mandrel mask layout so that the edge of the spacer aligns with shape 404.

Specifically, in some embodiments, once the core shapes in the mandrel mask layout are determined, the system can then determine the edges that will be printed by the spacer associated with the core shapes. For example, once shape 402 has been selected as a core shape in the mandrel mask layout, the system can determine that the spacer around core shape 402 will print the left and bottom edges of shape 404. Next, the system may place additional shape 406 in the mandrel mask layout so that the spacer around additional shape 406 prints the right edge of shape 404. Finally, the top edge of shape 404 can be printed by the trim mask layout. Note that the trim mask shown in FIG. 4F does not cover the location of additional shape 406. Thus the region corresponding to additional shape 406 becomes dielectric on the final wafer pattern.

Note that a graph does not have a two-coloring if the graph has an odd cycle. Some embodiments described in this disclosure provide systems and techniques for determining a mandrel mask layout and a trim mask layout for design intents that do not have a two-coloring. Specifically, in some embodiments, the system can make the graph two-colorable by merging two or more shapes in the design intent that violate one or more design rules (e.g., the two shapes may be separated by a spacing that is less than a minimum allowed spacing). Next, the system can use the trim mask layout to separate the merged shapes.

In some embodiments, the system merges a pair of shapes in the design intent that minimizes the run length of the edges that are merged. Minimizing the run length can minimize the length along which the trim mask layout needs to separate the merged shapes, thereby reducing the complexity and/or improving the manufacturability of the mask layouts.

FIGS. 5A-5D illustrate how shapes can be merged to make a graph corresponding to the design intent two-colorable and to minimize the run length of the merged shapes.

Figure 5A:
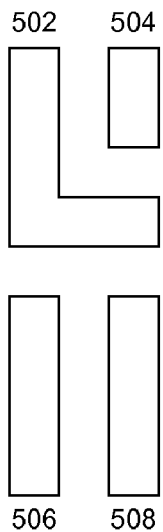
FIGS. 5A-5D illustrate how shapes can be merged to make a graph corresponding to the design intent two-colorable and to minimize the run length of the merged shapes.
Figure 5B:
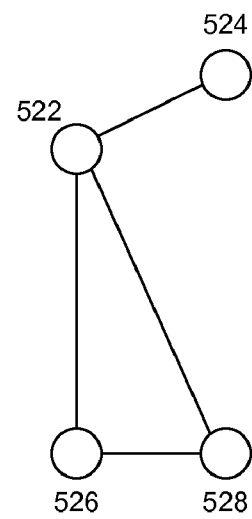

FIG. 5A illustrates design intent 500 which includes shapes 502-508. FIG. 5B illustrates graph 550 that corresponds to design intent 500. Vertices 522, 524, 526, and 528 correspond to shapes 502, 504, 506, and 508, respectively. Edges can be created between vertices that correspond to shapes that are separated by a spacing that is less than a minimum spacing.

For example, the space between shapes 502 and 504 is less than a minimum spacing; therefore, an edge has been created between vertices 522 and 524. Similarly, other edges have been created as shown in FIG. 5B. Graph 550 has an odd cycle: the cycle that includes vertices 522, 526, and 528. Therefore, graph 550 is not two-colorable.

Figure 5C:
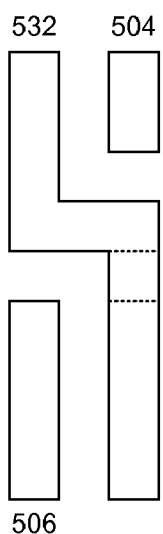
Figure 5D:
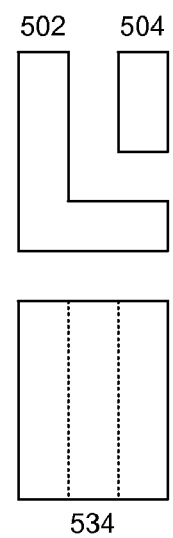

There are at least two options for merging shapes in design intent 500 to make the resulting graph two-colorable. One option is shown in FIG. 5C, in which shapes 502 and 508 have been merged to create shape 532. Another option is shown in FIG. 5D, in which shapes 506 and 508 have been merged to create shape 534. In both FIGS. 5C and 5D, the dotted lines show the edges that need to be printed by the trim mask layout to separate the merged shapes. The length of the segment along which the shapes are merged in FIG. 5C is less than the length of the segment along which the shapes are merged in FIG. 5D. Some embodiments described in this disclosure select the option illustrated in FIG. 5C.

The minimum spacing and line widths that can be printed by a lithography and etch step can depend on parameter settings of the semiconductor manufacturing equipment. Specifically, the sum of the minimum space and the minimum line width is called the minimum pitch. The wavelength of light that is used in the photolithography process can impose a lower limit on the minimum pitch that can be printed by the photolithography process. The settings of the semiconductor manufacturing equipment can be adjusted so that, for a given minimum pitch, the equipment can print line widths that are smaller than spaces, or print spaces that are smaller than line widths.

In some embodiments, the settings of the semiconductor manufacturing equipment in the first and second lithography steps are such that the equipment is able to print lines in the first lithography step that are thinner than the lines that can be printed in the second lithography process, and the equipment is able to print spaces in the second lithography step that are thinner than the spaces that can be printed in the first lithography process. For these reasons, the second lithography step is able to print the spaces shown by dotted lines in FIGS. 5C and 5D even though the first lithography step may not have been able to print these spaces.

Figure 6:
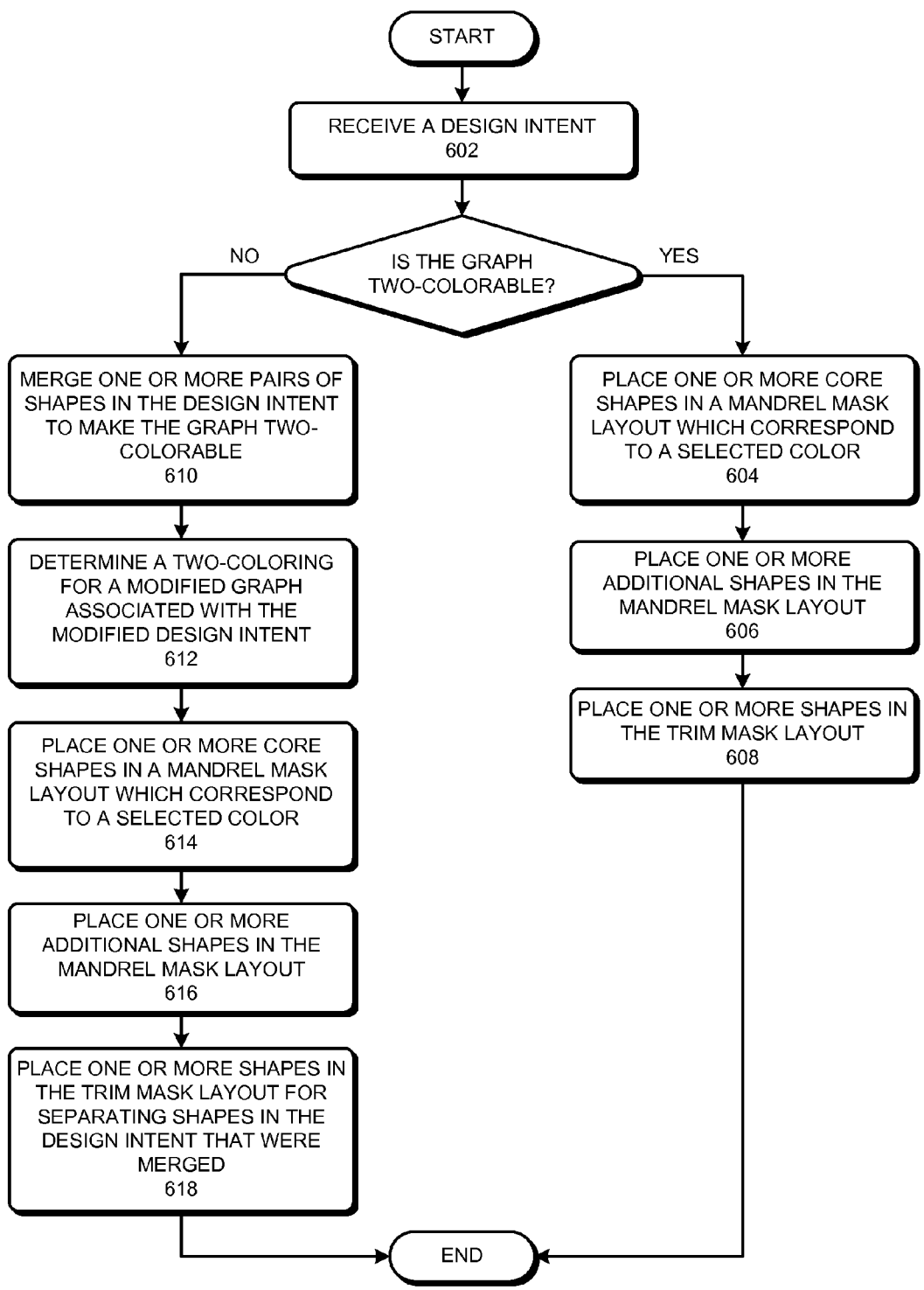
FIG. 6 presents a flowchart that illustrates a process for creating mandrel and trim mask layouts for printing a design intent that includes two-dimensional features using an SID SADP process.

FIG. 6 presents a flowchart that illustrates a process for creating mandrel and trim mask layouts for printing a design intent that includes two-dimensional features using an SID SADP process.

The process can begin by receiving a design intent (operation 602). The design intent can include two-dimensional patterns that correspond to a circuit design that implements an arbitrary logic function. If the graph corresponding to the design intent is two-colorable, the system can place one or more core shapes in a mandrel mask layout which correspond to a selected color (operation 604). The vertices in the graph can correspond to contiguous shapes in the design intent, and an edge can be created between two vertices in the graph if the corresponding shapes in the design intent violate one or more design rules, e.g., the distance between the shapes is less than a minimum spacing. Note that the system has two colors to choose from when creating the core shapes in the mandrel mask layout. In some embodiments, the system may select the color that maximizes the manufacturability of the design intent. Specifically, in some embodiments, the system may select the color that maximizes the length of edges that are printed by core shapes in the mandrel mask layout.

Once the cores shapes in the mandrel mask layout have been determined, the system can then place one or more additional shapes in the mandrel mask layout (operation 606). The additional shapes can print one or more edges of the design intent that are not printed by the core shapes. Next, the system can place one or more shapes in the trim mask layout (operation 608). Specifically, the system can place shapes in the trim mask layout to print one or more edges in the design intent that are not printed by the mandrel mask layout.

If the graph is not two-colorable, the system can merge one or more pairs of shapes in the design intent to make the graph two-colorable (operation 610). In some embodiments, the system can identify a pair of shapes in the design intent with a minimum run length, wherein merging the pair of shapes resolves a coloring conflict. The system can then merge the identified pair of shapes.

Next, the system can determine a two-coloring for a modified graph associated with the modified design intent (operation 612). The system can then place one or more core shapes in a mandrel mask layout which correspond to a selected color (operation 614). Next, the system can place one or more additional shapes in the mandrel mask layout (operation 616). Next, the system can place shapes in the trim mask layout to print one or more edges in the design intent that are not printed by the mandrel mask layout. Specifically, the system can place one or more shapes in the trim mask layout for separating shapes in the design intent that were merged (operation 618).

In some embodiments, after the system places the core and additional shapes in the mandrel mask layout, the system can remove and/or merge some of the additional shapes to reduce complexity and/or to improve manufacturability of the mask layouts.

Specifically, the system can identify a first additional shape and a second additional shape in the mandrel mask layout which are separated by a space that is less than a pre-determined distance which may depend on the two shapes and neighboring shapes. Next, the system can merge the first additional shape and the second additional shape, and place one or more shapes in the trim mask layout to remove any unwanted additional shapes. In some embodiments, the system can identify an additional shape in the mandrel mask layout that is smaller than a pre-determined size, and remove the additional shape from the mandrel mask layout. Removing additional shapes can effectively retarget the design intent. In some situations, retargeting the design intent in this manner may be acceptable (e.g., if the design intent represents a wire in a metal layer). If so, the system may decide not to add any shapes in the trim mask to print any edges that were removed in the retargeting.

FIGS. 7A-7F illustrate how additional shapes in the mandrel mask layout can be removed and/or merged to reduce complexity and/or improve manufacturability of the masks.

FIG. 7A can illustrate a portion of a mandrel mask layout. Additional shape 706 in the mandrel mask layout prints the right edge of design intent shape 702, and additional shape 708 in the mandrel mask layout prints the left edge of design intent shape 704. Note that design intent shapes 702 and 704 are not part of the mandrel mask layout. The small space between additional shapes 706 and 708 may violate a design rule check. As shown in FIG. 7B, some embodiments can merge additional shapes 706 and 708 to obtain additional shape 710, and in doing so, avoid design rule violations. The trim mask layout can then be used to remove the unwanted additional shapes.

Specifically, some embodiments described in this disclosure can identify two additional shapes in the mandrel mask layout that are separated by a space that is less than a pre-determined distance. Next, the system can merge the identified shapes in the mandrel mask layout. The system can then add or modify shapes in the trim mask layout to remove the additional shapes in the mandrel mask layout that were merged.

FIG. 7C can illustrate a portion of a mandrel mask layout. Additional shape 722 in the mandrel mask layout prints the corresponding edges of shape 720 in the design intent. Additional shape 722 may be difficult to print reliably due to its small size. In some embodiments, additional shape 722 may be removed, thereby retargeting shape 720 in the design intent to shape 724, as shown in FIG. 7D. In some cases retargeting shape 720 in the design intent may not be acceptable. In such cases, this optimization may not be used. However, in many cases such retargeting is acceptable. For example, if the design intent shapes correspond to wires in a metal layer, then retargeting shapes is generally acceptable as long as it does not change the electrical connectivity.

Specifically, in some embodiments, the system can identify an additional shape in the mandrel mask layout that is expected to have manufacturing problems, e.g., because the additional shape is smaller than a pre-determined size. Next, the system can determine whether removing the additional shape is expected to have a negligible impact on the performance and/or functional characteristics of the circuit design. If so, the system can remove the additional shape.

FIG. 7E can illustrate a portion of a mandrel mask layout. Additional shape 732 in the mandrel mask layout prints the corresponding edges of shape 730 in the design intent. Additional shape 732 may be difficult to print reliably due to its small size. As shown in FIG. 7F, additional shape 732 may be removed, and the trim mask layout may be used to print the edges that are not printed by the mandrel mask layout.

Specifically, in some embodiments, the system can identify an additional shape in the mandrel mask layout that is expected to have manufacturing problems, e.g., because the additional shape is smaller than a pre-determined size. Next, the system can remove the additional shape from the mandrel mask layout, and add one or more shapes to the trim mask layout to print edges in the design intent that are not printed by the mandrel mask layout.

Figure 8:
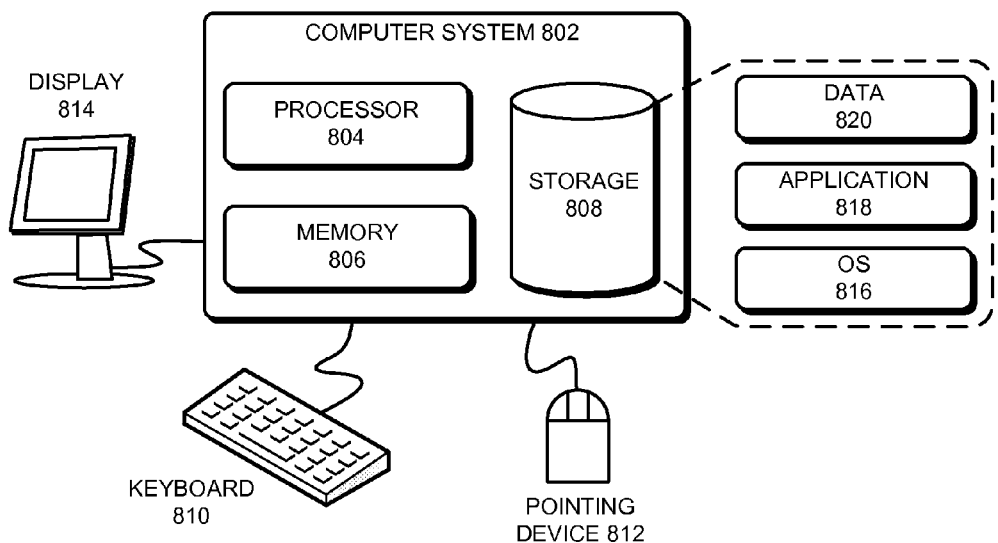
FIG. 8 illustrates a computer system.

FIG. 8 illustrates a computer system. Computer system 802 can include processor 804, memory 806, and storage device 808. Computer system 802 can be coupled to display device 814, keyboard 810, and pointing device 812. Storage device 808 can store operating system 816, application 818, and data 820. Data 820 can include design intents and mask layouts.

Computer system 802 may perform any method that is implicitly or explicitly described in this disclosure. Specifically, during operation, computer system 802 can load application 818 into memory 806. Application 818 can then automatically determine mask layouts based on a design intent and parameters associated with an SID SADP process. The mask layouts can then be used in the SID SADP process to print the design intent.

Figure 9:
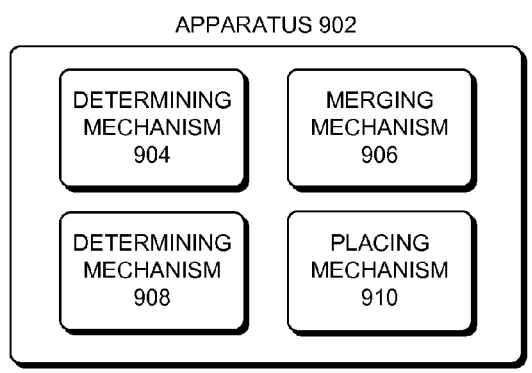
FIG. 9 illustrates an apparatus.

FIG. 9 illustrates an apparatus. Apparatus 902 can comprise a plurality of mechanisms which may communicate with one another via a wired or wireless communication channel. Apparatus 902 may be realized using one or more integrated circuits, and apparatus 902 may include fewer or more mechanisms than those shown in FIG. 9. Further, apparatus 902 may be integrated in a computer system, or it may be realized as a separate device which is capable of communicating with other computer systems and/or devices. Apparatus 902 can include one or more mechanisms which are configured to perform operations which are implicitly or explicitly described in this disclosure.

In some embodiments, apparatus 902 can include determining mechanism 904, merging mechanism 906, determining mechanism 908, and placing mechanism 910. Determining mechanism 904 may be configured to determine whether a graph corresponding to a design intent is two-colorable. Merging mechanism 906 may be configured to, in response to determining that the graph is not two-colorable, merge one or more pairs of shapes in the design intent to obtain a modified design intent, wherein a modified graph corresponding to the modified design intent is two-colorable. Determining mechanism 908 can be configured to determine a two-coloring for the modified graph. In some embodiments, determining mechanisms 904 and 908 can be the same. Placing mechanism 910 can be configured to place one or more shapes in the trim mask layout for separating shapes in the design intent that were merged.

CONCLUSION

The above description is presented to enable any person skilled in the art to make and use the embodiments. Various modifications to the disclosed embodiments will be readily apparent to those skilled in the art, and the general principles defined herein are applicable to other embodiments and applications without departing from the spirit and scope of the present disclosure. Thus, the present invention is not limited to the embodiments shown, but is to be accorded the widest scope consistent with the principles and features disclosed herein.

The data structures and code described in this disclosure can be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described in this disclosure include, but are not limited to, application-specific integrated circuits (ASICs), field-programmable gate arrays (FPGAs), dedicated or shared processors, and/or other hardware modules or apparatuses now known or later developed.

The methods and processes described in this disclosure can be partially or fully embodied as code and/or data stored in a computer-readable storage medium or device, so that when a computer system reads and executes the code and/or data, the computer system performs the associated methods and processes. The methods and processes can also be partially or fully embodied in hardware modules or apparatuses, so that when the hardware modules or apparatuses are activated, they perform the associated methods and processes. Note that the methods and processes can be embodied using a combination of code, data, and hardware modules or apparatuses.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for determining a mandrel mask layout and a trim mask layout for use in a spacer-is-dielectric (SID) self-aligned double-patterning (SADP) process, the method comprising:

determining whether a graph corresponding to a design intent is two-colorable, wherein the graph is two-colorable if a two-coloring can be determined for the graph;

in response to determining that the graph is not two-colorable, merging one or more pairs of shapes in the design intent to obtain a modified design intent, wherein merging the one or more pairs of shapes involves merging a first shape and a second shape in the design intent into a contiguous shape, and wherein a modified graph corresponding to the modified design intent is two-colorable;

determining a two-coloring for the modified graph;

placing, by computer, one or more core shapes in the mandrel mask layout which correspond to vertices in the modified graph that are associated with a first color in the two-coloring; and placing, by computer, one or more shapes in the trim mask layout for separating shapes in the design intent that were merged, wherein separating the shapes involves separating the contiguous shape into the first shape and the second shape using the trim mask layout.

2. The method of claim 1, wherein merging one or more pairs of shapes in the design intent includes identifying a pair of shapes in the design intent with a minimum run length, wherein merging the pair of shapes resolves a coloring conflict.

3. The method of claim 1, further comprising placing additional shapes in the mandrel mask layout, wherein the additional shapes print one or more edges of the design intent that are not printed by the core shapes.

4. The method of claim 3, further comprising:
identifying a first additional shape and a second additional shape in the mandrel mask layout which are separated by a space that is less than a predetermined distance; and
merging the first additional shape and the second additional shape.

5. The method of claim 3, further comprising:
identifying an additional shape in the mandrel mask layout that is smaller than a pre-determined size; and
removing the additional shape from the mandrel mask layout.

6. The method of claim 1, further comprising adding one or more shapes in the trim mask layout to print one or more edges in the design intent that are not printed by the mandrel mask layout.

7. The method of claim 1, wherein each vertex in the graph corresponds to a shape in the design intent, and each edge in the graph corresponds to two shapes in the design intent that are separated by a space that is less than a pre-determined distance.

8. The method of claim 1, wherein the design intent includes two-dimensional patterns that correspond to a circuit design that implements an arbitrary logic function.

9. A non-transitory computer-readable storage medium storing instructions that when executed by a computer cause the computer to perform a method for determining a mandrel mask layout and a trim mask layout for use in a spacer-is-dielectric (SID) self-aligned double-patterning (SADP) process, the method comprising:

determining whether a graph corresponding to a design intent is two-colorable, wherein the graph is two-colorable if a two-coloring can be determined for the graph;

in response to determining that the graph is not two-colorable, merging one or more pairs of shapes in the design intent to obtain a modified design intent, wherein merging the one or more pairs of shapes involves merging a first shape and a second shape in the design intent into a contiguous shape, and wherein a modified graph corresponding to the modified design intent is two-colorable;
determining a two-coloring for the modified graph;
placing, by computer, one or more core shapes in the mandrel mask layout which correspond to vertices in the modified graph that are associated with a first color in the two-coloring; and
placing, by computer, one or more shapes in the trim mask layout for separating shapes in the design intent that were merged, wherein separating the shapes involves separating the contiguous shape into the first shape and the second shape using the trim mask layout.

10. The non-transitory computer-readable storage medium of claim 9, wherein merging one or more pairs of shapes in the design intent includes identifying a pair of shapes in the design intent with a minimum run length, wherein merging the pair of shapes resolves a coloring conflict.

11. The non-transitory computer-readable storage medium of claim 9, wherein the method further comprises placing additional shapes in the mandrel mask layout, wherein the additional shapes print one or more edges of the design intent that are not printed by the core shapes.

12. The non-transitory computer-readable storage medium of claim 11, wherein the method further comprises:
identifying a first additional shape and a second additional shape in the mandrel mask layout which are separated by a space that is less than a predetermined distance; and
merging the first additional shape and the second additional shape.

13. The non-transitory computer-readable storage medium of claim 11, wherein the method further comprises:
identifying an additional shape in the mandrel mask layout that is smaller than a pre-determined size; and
removing the additional shape from the mandrel mask layout.

14. The non-transitory computer-readable storage medium of claim 9, wherein the method further comprises adding one or more shapes in the trim mask layout to print one or more edges in the design intent that are not printed by the mandrel mask layout.

15. The non-transitory computer-readable storage medium of claim 9, wherein each vertex in the graph corresponds to a shape in the design intent, and each edge in the graph corresponds to two shapes in the design intent that are separated by a space that is less than a pre-determined distance.

16. The non-transitory computer-readable storage medium of claim 9, wherein the design intent includes two-dimensional patterns that correspond to a circuit design that implements an arbitrary logic function.

17. A system, comprising:
a processor; and
a memory storing instructions that when executed by a computer cause the computer to perform a method for determining a mandrel mask layout and a trim mask layout for use in a spacer-is-dielectric (SID) self-aligned double-patterning (SADP) process, the method comprising:
determining whether a graph corresponding to a design intent is two-colorable, wherein the graph is two-colorable if a two-coloring can be determined for the graph;
in response to determining that the graph is not two-colorable, merging one or more pairs of shapes in the design intent to obtain a modified design intent, wherein merging the one or more pairs of shapes involves merging a first shape and a second shape in the design intent into a contiguous shape, and wherein a modified graph corresponding to the modified design intent is two-colorable;
determining a two-coloring for the modified graph;
placing, by computer, one or more core shapes in the mandrel mask layout which correspond to vertices in the modified graph that are associated with a first color in the two-coloring; and
placing, by computer, one or more shapes in the trim mask layout for separating shapes in the design intent that were merged, wherein separating the shapes involves separating the contiguous shape into the first shape and the second shape using the trim mask layout.

18. The system of claim 17, wherein merging one or more pairs of shapes in the design intent includes identifying a pair of shapes in the design intent with a minimum run length, wherein merging the pair of shapes resolves a coloring conflict.

19. The system of claim 18, wherein the method further comprises placing additional shapes in the mandrel mask layout, wherein the additional shapes print one or more edges of the design intent that are not printed by the core shapes.

20. The system of claim 19, wherein the method further comprises:
identifying a first additional shape and a second additional shape in the mandrel mask layout which are separated by a space that is less than a predetermined distance; and
merging the first additional shape and the second additional shape.

21. The system of claim 19, wherein the method further comprises:
identifying an additional shape in the mandrel mask layout that is smaller than a pre-determined size; and
removing the additional shape from the mandrel mask layout.

22. The system of claim 17, wherein the method further comprises adding one or more shapes in the trim mask layout to print one or more edges in the design intent that are not printed by the mandrel mask layout.

23. The system of claim 17, wherein each vertex in the graph corresponds to a shape in the design intent, and each edge in the graph corresponds to two shapes in the design intent that are separated by a space that is less than a pre-determined distance.

24. The system of claim 17, wherein the design intent includes two-dimensional patterns that correspond to a circuit design that implements an arbitrary logic function.

* * * * *